(12) United States Patent
Zare-Hoseini

(10) Patent No.: US 8,994,570 B1
(45) Date of Patent: Mar. 31, 2015

(54) MULTI-LEVEL QUANTIZERS AND ANALOGUE-TO-DIGITAL CONVERTERS

(71) Applicant: Cambridge Silicon Radio Limited, Cambridge (GB)

(72) Inventor: Hashem Zare-Hoseini, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 14/037,962

(22) Filed: Sep. 26, 2013

(51) Int. Cl.
| | |
|---|---|
| *H03M 1/12* | (2006.01) |
| *H03M 1/34* | (2006.01) |
| *H03M 1/78* | (2006.01) |
| *H03M 1/36* | (2006.01) |
| *H03M 1/00* | (2006.01) |

(52) U.S. Cl.
CPC ........ *H03M 1/34* (2013.01); *H03M 1/12* (2013.01); *H03M 1/785* (2013.01); *H03M 1/365* (2013.01); *H03M 1/00* (2013.01)
USPC .......................................... 341/155; 341/158

(58) Field of Classification Search
CPC ......... H03M 1/12; H03M 1/00; H03M 1/365; H03M 1/785
USPC .................. 341/155, 158, 159, 120, 154, 121
See application file for complete search history.

(56) References Cited

U.S. PATENT DOCUMENTS

| | | | | |
|---|---|---|---|---|
| 5,774,733 A | * | 6/1998 | Nolan et al. .................. | 713/300 |
| 2012/0007761 A1 | * | 1/2012 | Nakada .......................... | 341/155 |

* cited by examiner

*Primary Examiner* — Joseph Lauture
(74) *Attorney, Agent, or Firm* — Vorys, Sater, Seymour and Pease LLP; Vincent M DeLuca

(57) ABSTRACT

An analog-to-digital converter employs one or more reference ladders for generating reference voltages with which to compare the analog signal for quantization. Selected impedances of the reference ladder can be dynamically decoupled from the input signal in dependence on the value of the output signal in order to reduce headroom in the reference ladders, thus making possible accurate quantization in low-voltage applications.

15 Claims, 4 Drawing Sheets

MULTI-LEVEL QUANTIZERS AND ANALOGUE-TO-DIGITAL CONVERTERS

TECHNICAL FIELD

Embodiments of the invention relate to multi-level quantizers, and to analogue-to-digital converters.

BACKGROUND

From seismic monitoring to audio to wireless applications, delta-sigma (DS) analogue-to-digital converters (ADCs) have been widely used due to their relaxed analogue requirements, inherent anti-aliasing filtering and low power consumption. With the widespread use of portable electronic equipment, low-power and low-cost designs become crucially important in many applications. Hence there have been many proposals and novel implementations to improve the with the aim of cost and power-consumption reduction.

The quantizers of such ADCs can be implemented in many ways, but usually operate by comparing an analogue signal to a series of references, and then generating an n-bit digital output in accordance with the comparisons. In certain applications a greater number of bits in the quantizer can be desirable for many reasons.

One possible implementation uses one or more reference ladders (e.g. a chain of series-connected resistors) to generate a series of voltages at the nodes between the resistors, all separated by a reference voltage equal to the voltage drop across the resistor.

In a stable and low-cost industrial design, due to the mismatch between components, the reference ladders may require reference voltages of the order of 50 mV or more, otherwise calibration and trimming may be needed. For a 3-bit output signal, requiring six resistors, such a reference ladder will consume headroom of 300 mV; for a 4-bit output signal, requiring 14 resistors, the reference ladder will consume headroom of 700 mV.

The input signal to be quantized may also add to the total voltage swing of the reference ladder, and thus it is clear that output signals having a resolution of 4-bits or greater will be difficult to achieve in low-voltage applications, due to the excess headroom required by the reference ladders. A solution is needed.

SUMMARY OF INVENTION

According to a first aspect of the invention, there is provided an analogue-to-digital converter, comprising: one or more reference ladders coupled to receive an input signal to be quantized, each reference ladder comprising a plurality of impedances, and a current source providing a reference current through the plurality of impedances, a plurality of nodes being interleaved with the plurality of impedances; a switching arrangement, for coupling and decoupling one or more of the plurality of impedances from the input signal; a plurality of comparators, each comparator coupled to receive signals from respective nodes of the one or more reference ladders, and to provide an output comparison signal; an output, configured to receive the plurality of output comparison signals and to output a quantized signal corresponding to the input signal; and control logic, configured to control the switching arrangement in dependence on the quantized signal.

BRIEF DESCRIPTION OF THE DRAWINGS

For a better understanding of the invention, and to show more clearly how it may be carried into effect, reference will now be made, by way of example, to the following drawings, in which.

DETAILED DESCRIPTION

Figure 1:
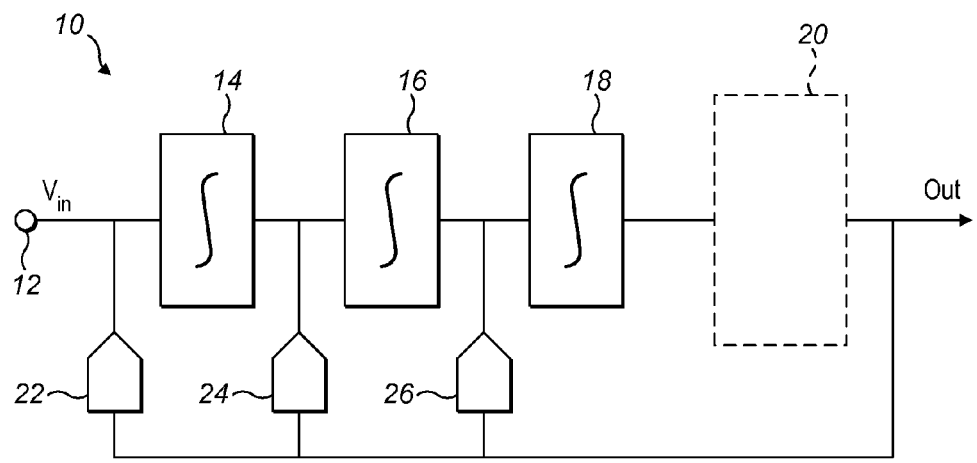
FIG. 1 shows a delta-sigma (DS) analogue-to-digital converter (ADC) with a feedback topology according to embodiments of the invention.

FIG. 1 shows a feedback, third-order DS ADC 10 according to embodiments of the invention.

An input 12 receives an analogue input signal $V_{in}$ which is to be converted to digital. Three integrators 14, 16, 18 are used in series to successively integrate the combination of the analogue input signal with a respective feedback signal. The output of the third integrator 18 is fed to a quantizer 20, where it is compared with a series of references in order to generate an n-bit output Out. As previously stated, the n-bit output Out is fed back via a single feedback loop having three output paths, and subtracted from the inputs of each of the integrators 14, 16, 18. Digital-to-analogue converters (DACs) 22, 24, 26 convert the digital signal Out to analogue prior to its subtraction from the inputs of the respective integrators 14, 16, 18. It will be appreciated by the skilled person that alternatively a single DAC may be employed in the feedback loop to convert the signal Out to analogue.

Figure 2:
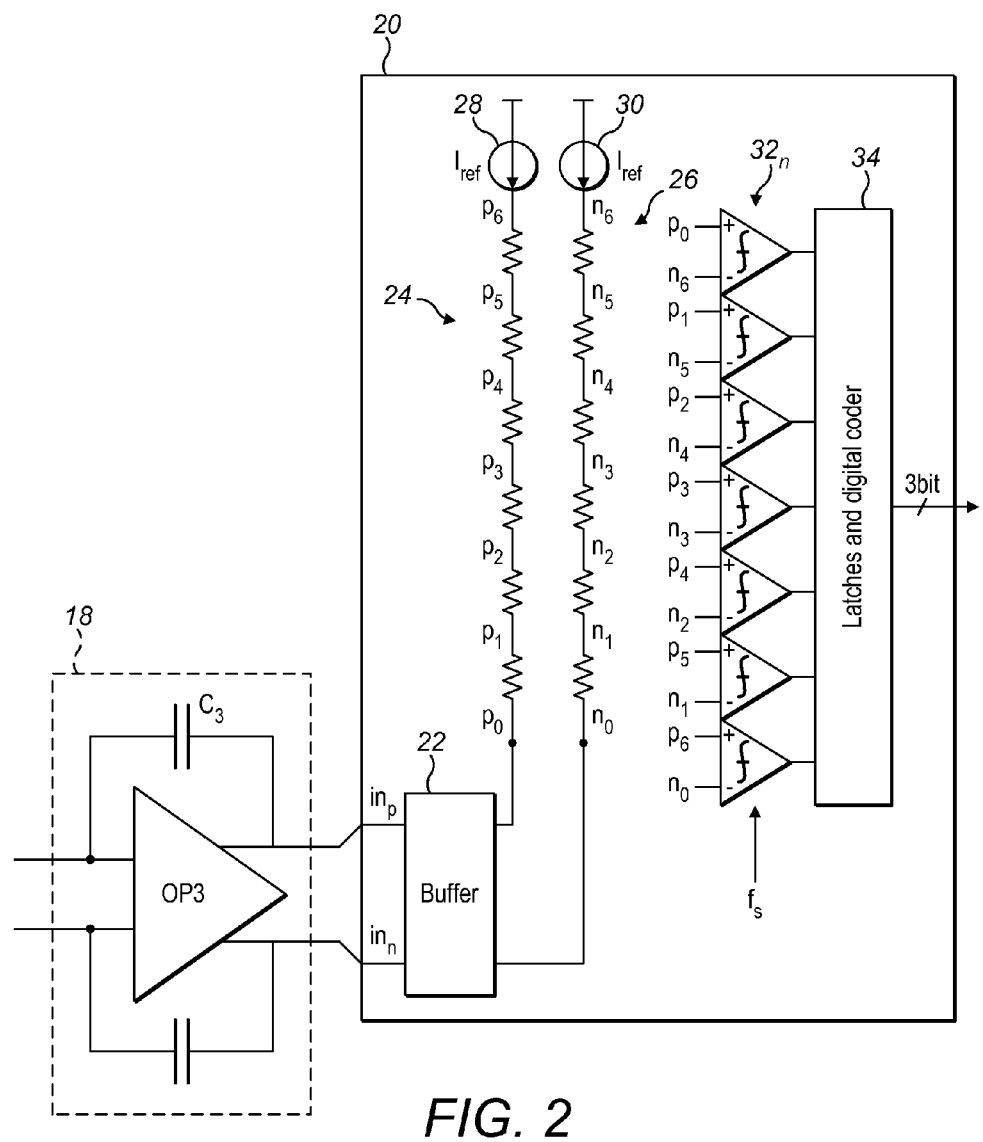
FIG. 2 shows a conventional implementation of the quantizer in the ADC of FIG. 1.

The quantizer 20 can be implemented in various ways. FIG. 2 shows one example of a conventional quantizer 20 in which the input is a differential signal having positive and negative components, and also shows a possible implementation of the third integrator 18.

The integrator 18 comprises an opamp OP3, with respective capacitors $C_3$ connected between the positive input and the positive output, and the negative input and the negative output. Each of the integrators 14, 16, 18 can be implemented in this way, although alternative circuits will be apparent to the skilled person. The outputs of the third integrator 18 are fed to the quantizer 20.

The inputs to the quantizer 20 are labelled $in_p$ for the positive component of the signal, and $in_n$ for the negative component. Both components are buffered in a buffer 22 although this is optional and the components may not be buffered at all. One possible implementation of the buffer 22 includes respective transistors for the positive and negative components of the signal, with those components connected to the gate terminals of the transistors. The drain terminals are connected to a reference voltage (such as ground), and the source terminals are connected respectively to positive and negative reference ladders.

The quantizer 20 further comprises positive and negative reference ladders 24, 26, with the positive and negative signal components $in_p$ and $in_n$ being connected to respective ends of the reference ladders 24, 26. The illustrated example generates a 3-bit output signal, and thus each reference ladder comprises a chain of six series-connected resistors, with reference nodes at both ends of the ladders, and between pairs of resistors in the ladder. Nodes $p_0$ and $n_0$ are positioned at the start of the reference ladders, and thus the voltages at these nodes are equal to $in_p$ and $in_n$ respectively; nodes $p_1$ to $p_5$ and $n_1$ to $n_5$ are positioned between the resistors of the positive and negative reference ladders, respectively; and nodes $p_6$ and $n_6$ are positioned at the ends of the positive and negative reference ladders, respectively.

In the illustrated example, for simplicity, each of the resistors in the reference ladders 24, 26 is identical and has the same value of resistance. Those skilled in the art will appreciate, however, that resistors having different resistances could be employed depending on the reference voltages which are required for quantization. Similarly, the illustrated example includes nodes between each consecutive pair of resistors in the ladder. Those skilled in the art will appreciate that in alternative arrangements nodes may be placed only between certain resistors, grouping resistances into identical or different groups to achieve reference voltages as required for quantization.

Current sources 28, 30 generate a reference current $I_{ref}$ through the positive reference ladder 24 and the negative reference ladder 26 respectively. Assuming this reference current is constant and the resistors are all identical, the voltages at the respective nodes are as follows:

$$V_{p6} = V_{inp} + 6U_{ref} \quad V_{n6} = V_{inn} + 6U_{ref}$$
$$V_{p5} = V_{inp} + 5U_{ref} \quad V_{n5} = V_{inn} + 5U_{ref}$$
$$\ldots \quad \ldots$$
$$V_{p0} = V_{inp} \quad V_{n0} = V_{inn}$$

where $U_{ref}$ is the reference voltage drop across each of the resistors as a result of the current $I_{ref}$.

Note that, in alternative embodiments, the reference ladders may employ capacitors or other impedances instead of resistors in order to generate the reference voltage drop $U_{ref}$.

The quantizer 20 further comprises seven comparators $32n$ which are arranged to compare the voltages at the nodes of the positive and negative reference ladders in order to generate a quantization decision. In the illustrated example, which is a continuous time DS ADC, each comparator is driven to generate an output at a sampling frequency $f_s$. In other examples which are not continuous time, the input signal itself may be latched at a particular sampling frequency.

Each comparator $32n$ compares the voltage at one node of the positive reference ladder 24 with the voltage at a corresponding node of the negative reference ladder 26. In the illustrated example, the nodes are paired such that the voltage at $p_6$ is compared with the voltage at $n_0$ in one comparator $32_7$, the voltage at $p_5$ is compared with the voltage at $n_1$ in another comparator $32_6$, and so on until the voltage at $p_0$ is compared with the voltage at $n_6$ in the final comparator $32_1$. The differential signal $V_{in}$ is equal to $V_{inp} - V_{inn}$, and thus the seven comparators $32_1$ to $32_7$ effectively compare the differential signal $V_{in}$ with seven different reference voltages:

$32_7$: $V_{in} <> +6U_{ref}$
$32_6$: $V_{in} <> +4U_{ref}$
$32_5$: $V_{in} <> +2U_{ref}$
$32_4$: $V_{in} <> 0U_{ref}$
$32_3$: $V_{in} <> -2U_{ref}$
$32_2$: $V_{in} <> -4U_{ref}$
$32_1$: $V_{in} <> -6U_{ref}$ The outputs of the respective comparators 32 are latched, and a digital coder 34 generates a 3-bit output signal on the basis of the seven comparison signals generated by the comparators.

As described above, a problem with the quantizer 20 shown in FIG. 2 is that, depending on the level of the input voltage, the voltage swing at nodes $p_6$ and $n_6$ can be very significant indeed. With each resistor in the reference ladder consuming 50 mV for a typical implementation, the 3-bit example illustrated consumes 300 mV of headroom. A 4-bit example would consume 700 mV headroom and a greater number of bits consumes exponentially greater headroom.

Embodiments of the invention seek to address this problem by adjusting the reference ladder dynamically to track the input and output signals of the quantizer.

In more detail, delta-sigma modulators have an inherently oversampling nature such that the high-frequency output signal tends to track closely the low-frequency input signal. The oversampling ratio (OSR) is defined as the ratio of the sampling frequency to the Nyquist rate of the input bandwidth. The higher the OSR and the greater the number of bits in the output signal, the smoother the tracking between the digital output and the analogue input. Embodiments of the invention thus utilize an OSR which is reasonably high, e.g. 8 or more. In certain embodiments, the OSR may be equal to 10 or more and in other embodiments still the OSR may be equal to 50 or more. The input signal will therefore not have changed drastically from one sample of the output signal to the sample immediately following. Depending on the value of the OSR, the output signal may shift one, two or possibly a few quantization levels in consecutive samples, but is unlikely to have shifted very many quantization levels at once.

In order to make a quantization decision, therefore, only certain comparators of the quantizer need to be active at any one time. For example, say the output signal at a sampling interval $t_n$ is equal to $+3U_{ref}$. To make that decision, only comparators $32_5$ and $32_6$ need to be active. At the next sampling interval $t_{n+1}$, and assuming the OSR is sufficiently high, it can be assumed that the input signal can only have moved up to $5U_{ref}$, stayed at $+3U_{ref}$, or moved down to $+1U_{ref}$. Thus for the sampling interval $t_{n+1}$, comparators $32_1$, $32_2$, $32_3$ and $32_4$ can be deactivated.

Further still, if only a subset of the comparators 32 is active for any one sample of the digital output signal, also only a subset of the references in the reference ladders 24, 26 is in operation for that sample. According to embodiments of the invention, this principle can be used to reduce the voltage swing at the reference ladders as will be explained below.

Figure 3:
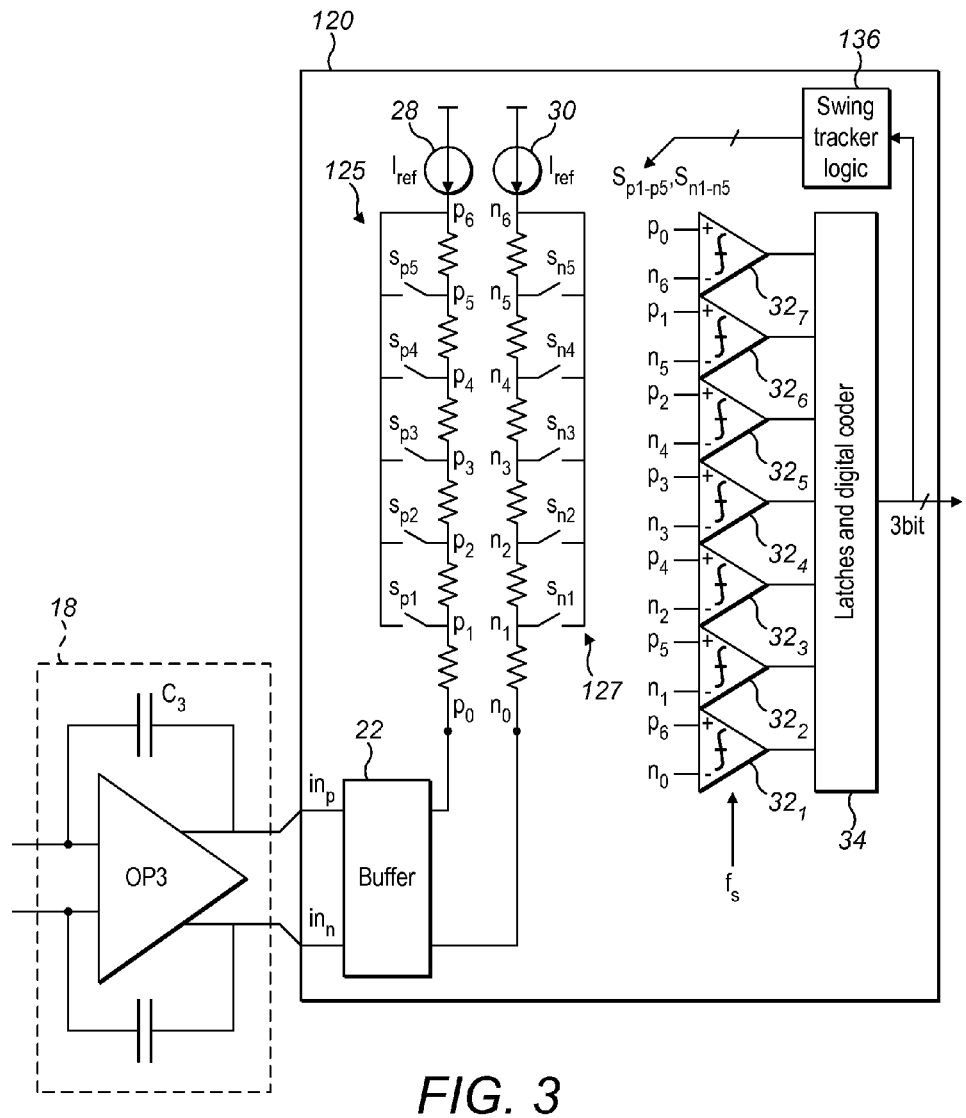
FIG. 3 shows a quantizer according to embodiments of the invention.

FIG. 3 shows a quantizer 120 according to embodiments of the invention. Also shown is the third integrator 18; this is identical to the component described previously and therefore a similar reference numeral is employed. In general, features which are identical to those described previously are given like reference numerals.

The quantizer 120 is substantially identical to the quantizer 20 illustrated in FIG. 2, save for some extra features which will now be explained. First and second switching arrangements 125, 127 are provided for the positive and negative reference ladders 24, 26 respectively, which allow one or more of the resistors in each ladder to be effectively disconnected from the current path between the input signal and from the current sources 28, 30.

In the illustrated embodiment, the first switching arrangement 125 provides that node $p_1$ is connected to node $p_6$ (i.e. the node at the end of the reference ladder 24) via a switch $S_{p1}$; node $p_2$ is connected to node $p_6$ via a switch $S_{p2}$; and so on until node $p_5$ is connected to node $p_6$ via a switch $S_{p5}$. Similarly, the second switching arrangement 127 provides that node $n_1$ is connected to node $n_6$ (i.e. the node at the end of the reference ladder 26) via a switch $S_{n1}$; node $n_2$ is connected to node $n_6$ via a switch $S_{n2}$; and so on until node $n_5$ is connected to node $n_6$ via a switch $S_{n5}$.

Thus, by closing switch $S_{p1}$, the reference ladder 24 is effectively shortened to contain only a single resistor between the input signal and the current source 28; the remaining resistors are disconnected from the current path. By closing switch $S_{p2}$ and opening switch $S_{p1}$, the reference ladder 24 is effectively shortened to contain only two resistors between the input signal and the current source 28. The other switches of the first switching arrangement 125 operate in a similar manner to disconnect different resistors from the current path. Thus, by closing any of the switches $S_p$, the effective length of the positive reference ladder 24 can be shortened. The switches $S_n$ of the second switching arrangement 127 can be closed to effectively shorten the negative reference ladder 26 in a similar manner.

The quantizer 120 further comprises logic circuitry 136 which receives the quantized output signal Out and generates control signals for the switching arrangements 125, 127 as described in more detail below.

Let's assume that $V_{in}$ is a sine signal applied to the quantizer 120. At a particular sampling time $t_n$, $V_{in}$ is around its positive peak. This means that $V_{inp}$ is around its maximum (and so $V_{p6}$ is also at its maximum), while $V_{inn}$ is around its minimum (and $V_{n6}$ is also around its minimum). Hence it is desirable to reduce the swing of $V_{p6}$.

It can be observed from the equations above that comparators $32_6$ and $32_7$ are active to make the quantization decision when $V_{in}$ is at or near its maximum value, while comparators $32_1$ to $32_5$ are inactive. Thus the only voltages which are required are those at nodes $p_0$, $p_1$, $n_5$ and $n_6$. The voltages at nodes $p_2$ to $p_6$ are not required.

In the next sampling time $t_{n+1}$, assuming the OSR is sufficiently high, it can be assumed that $V_{in}$ will not have changed significantly from its value at $t_n$ and thus the only comparators which will be active are comparators $32_6$ and $32_7$. In this situation, switch $S_{p1}$ can be closed for the sampling interval $t_{n+1}$, and thus the logic circuitry 136 generates a suitable control signal. Consequently the highest swing of the positive reference ladder 24 which happens at $p_6$ goes down from $V_{inp}+6U_{ref}$ to $V_{inp}+U_{ref}$, a drop of $5U_{ref}$.

If $V_{in}$ is around its negative peak i.e. $V_{p6}$ is close to its minimum and $V_{n6}$ is around its maximum value, the swing of $V_{n6}$ should be reduced. In this situation, comparators $32_1$ and $32_2$ are in operation to make the quantization decision while comparators $32_3$ to $32_7$ are inactive. Hence, only the voltages at nodes $n_0$, $n_1$, $p_5$ and $p_6$ are needed to make a correct decision. Therefore, in a similar manner to that described above, switch $S_{n1}$ can be closed for the following sampling interval, and thus the logic circuitry 136 generates a suitable control signal. Consequently the highest swing of the negative reference ladder 26 which happens at $V_{n6}$ is reduced from $V_{inn}+6U_{ref}$ to $V_{inn}+U_{ref}$.

When the swing of $V_{in}$ is small, i.e. both $V_{inp}$ and $V_{inn}$ are around their mid points, the output of the quantizer 120 can be decided only by comparator $32_4$. Hence, only those voltages at nodes $p_3$ and $n_3$ are needed for making the quantization decision and in the subsequent sampling time interval switches $S_{93}$ and $S_{n3}$ can both be closed. The highest swing of the positive reference ladder which happens at $V_{p6}$ goes down from $V_{inp}+6U_{ref}$ to $V_{inp}+3U_{ref}$, while the highest swing of the negative reference ladder which happens at $V_{n6}$ goes down from $V_{inn}+6U_{ref}$ to $V_{inn}+3U_{ref}$.

The same algorithm can of course be used by the logic circuitry 136 to control other switches of the switching arrangements 125, 127, depending on the value of a preceding sample of the output signal Out, such that the number of resistors which are connected in each of the reference ladders 24, 26 can be varied according to the amplitude of the signal.

In general, embodiments of the invention therefore allow fewer nodes to be used in making a quantization decision without compromising on the accuracy of the decision itself. In some embodiments of the invention, the required number of reference voltages may vary depending on how accurate the tracking is between the analogue quantizer input and its digital output. For example, the output of a quantizer using a high OSR and/or having a high number of bits will track the analogue input closely. In that case the control over the number of resistors connected in the reference ladder can be managed at a high level of granularity. If the OSR is low, however, or if the quantizer uses only two bits (for example), the digital output signal may not track the analogue input as closely. In that case the output of the digital signal may change more significantly from one sample to the next, and therefore the control over the number of resistors connected in the reference ladder can be managed at a reduced level of granularity. For example, the switching arrangements 125, 127 may not comprise a switch for every node of the reference ladder, or the logic circuitry 136 may control the switches so that only every other switch rather than every switch in the switching arrangement is controlled.

The invention has been described with respect to a continuous-time, feedback, third order, 3-bit delta-sigma modulator. However, those skilled in the art will appreciate that the principles described above can be applied within any quantizer utilizing one or more reference ladders, regardless of the number of bits. Further, the quantizer can be employed in any modulator or ADC, not just delta-sigma modulators (whether continuous time or switched capacitor), and in any topology (i.e. feedback, feedforward, hybrid, etc). For example the quantizer can be used in a standalone Flash ADC.

Figure 4:
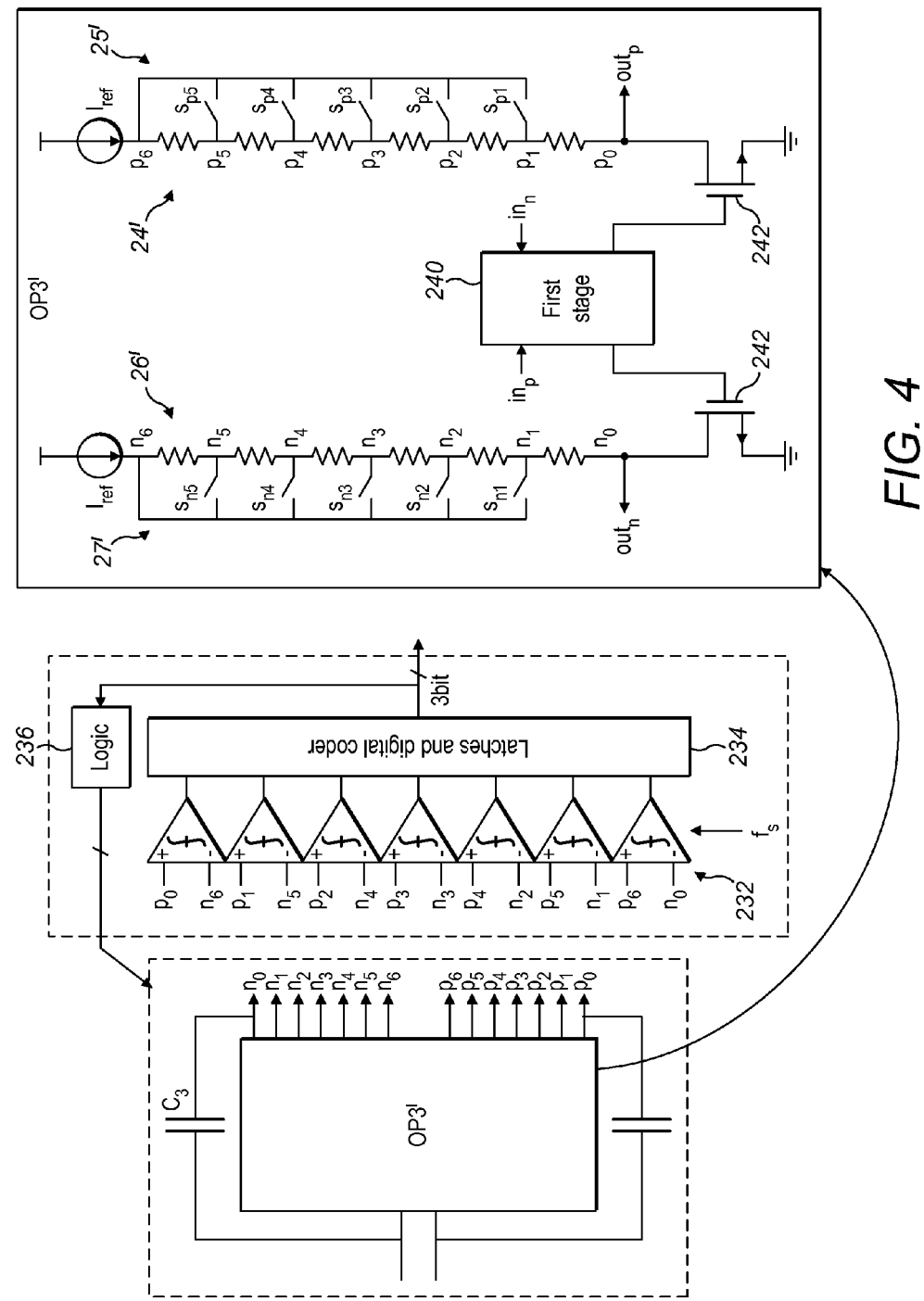
FIG. 4 shows a quantizer according to further embodiments of the invention.

FIG. 4 shows the combination of an integrator 218 and a quantizer 220 according to further embodiments of the invention in which the reference ladders are incorporated into the final stage of the final integrator 218, rather than the quantizer 220 itself.

The integrator 218 comprises an opamp OP3', with respective capacitors $C_3$ connected between the positive input and the positive output, and the negative input and the negative output. The opamp OP3' comprises a first amplification stage 240 which receives a differential input signal $in_n$, $in_p$ to be amplified. The positive and negative outputs of the first amplified stage are fed to a final stage. In the illustrated embodiment the final stage comprises two PMOS transistors 242 with the positive and negative components of the signal connected to their respective gate terminals. The source terminals of the respective transistors are connected to a reference voltage (e.g. ground), while the drain terminals of the respective transistors are coupled to respective reference ladders 24', 26' in the same manner as the input signals $in_n$ and $in_p$ are coupled to reference ladders 24, 26 in the embodiment described with respect to FIG. 3. The reference ladders 24', 26' are thus effectively coupled to receive the input signal to be quantized. First and second switching arrangements 25', 27' are again provided for the positive and negative reference ladders 24', 26' respectively.

The quantizer 220 comprises a plurality of comparators 232 which receive the voltages at the nodes of the reference ladders 24', 26', a digital coder 234 for receiving the outputs of the comparators and generated a quantized signal, and logic circuitry 236 which receives the quantized signal and generates control signals in the manner described above, with the exception that the control signals are provided to the switching arrangements 25', 27' in the integrator 218. Otherwise the circuit operates in the same manner as that described above.

Embodiments of the present invention thus provide methods and circuits for converting an analogue input signal to a digital output signal. The circuits employ one or more reference ladders for generating reference voltages with which to compare the analogue signal for quantization. Selected impedances of the reference ladder can be dynamically decoupled from the input signal in dependence on the value of the output signal in order to reduce headroom in the reference ladders, thus making possible accurate quantization in low-voltage applications.

Those skilled in the art will appreciate that various amendments and alterations can be made to the embodiments described above without departing from the scope of the invention as defined in the claims appended hereto.

The invention claimed is:

1. An analogue-to-digital converter, comprising:
   one or more reference ladders coupled to receive an analogue input signal to be quantized, each reference ladder comprising a plurality of impedances, and a current source providing a reference current through the plurality of impedances, a plurality of nodes being interleaved with the plurality of impedances;
   a switching arrangement, for coupling and decoupling one or more of the plurality of impedances from the input signal;
   a plurality of comparators, each comparator coupled to receive signals from respective nodes of the one or more reference ladders, and to provide an output comparison signal;
   an output, configured to receive the plurality of output comparison signals and to output a digital quantized signal corresponding to the input signal; and
   control logic, configured to control the switching arrangement in dependence on the quantized signal.

2. The analogue-to-digital converter of claim 1, wherein the input signal is a differential signal, and wherein the one or more reference ladders comprise a first reference ladder coupled to a positive component of the differential signal and a second reference ladder coupled to a negative component of the differential signal.

3. The analogue-to-digital converter of claim 2, wherein each comparator of the plurality of comparators is coupled to corresponding nodes of the first and second reference ladders.

4. The analogue-to-digital converter of claim 3, wherein the first and second reference ladders each comprise N nodes, where N is an integer greater than or equal to 2, and wherein the ith comparator is coupled to the ith node of the first reference ladder, and the (N−i)th node of the second reference ladder.

5. The analogue-to-digital converter of claim 1, wherein the quantized signal is oversampled.

6. The analogue-to-digital converter of claim 1, wherein the impedances are resistors.

7. The analogue-to-digital converter of claim 6, wherein the resistors are connected in series.

8. The analogue-to-digital converter of claim 7, further comprising one or more feedback paths from the output to an input of the one or more integrators.

9. The analogue-to-digital converter of claim 1, further comprising one or more integrators.

10. The analogue-to-digital converter of claim 9, wherein the one or more reference ladders are integrated within a final one of the one or more integrators.

11. An analogue-to-digital converter, comprising:
    one or more reference ladders coupled to receive an input signal to be quantized, each reference ladder comprising a plurality of impedances, and a current source providing a reference current through the plurality of impedances, a plurality of nodes being interleaved with the plurality of impedances;
    a switching arrangement, for coupling and decoupling one or more of the plurality of impedances from the input signal;
    a plurality of comparators, each comparator coupled to receive signals from respective nodes of the one or more reference ladders, and to provide an output comparison signal;
    an output, configured to receive the plurality of output comparison signals and to output a quantized signal corresponding to the input signal; and
    control logic, configured to control the switching arrangement in dependence on the quantized signal, wherein the quantized signal comprises a train of quantized samples, and wherein the control logic is arranged to control the switching arrangement for a particular sample of the train of samples in dependence on a value of a preceding sample in the train of samples.

12. The analogue-to-digital converter of claim 11, wherein the control logic is configured to control the switching arrangement to decouple one or more impedances from the input signal in dependence on the value of the preceding sample relative to a maximum value of the quantized signal.

13. The analogue-to-digital converter of claim 12, wherein the control logic is configured to control the switching arrangement for the particular sample such that all impedances of the plurality of impedances are coupled to the input signal in the event that the value of the preceding sample has the maximum value of the quantized signal.

14. The analogue-to-digital converter of claim 12, wherein the control logic is configured to control the switching arrangement for the particular sample such that a single impedances of the plurality of impedances is coupled to the input signal in the event that the value of the preceding sample has a minimum value of the quantized signal.

15. An analogue-to-digital converter, comprising:
    one or more reference ladders coupled to receive an input signal to be quantized, each reference ladder comprising a plurality of impedances, and a current source providing a reference current through the plurality of impedances, a plurality of nodes being interleaved with the plurality of impedances;
    a switching arrangement, for coupling and decoupling one or more of the plurality of impedances from the input signal;
    a plurality of comparators, each comparator coupled to receive signals from respective nodes of the one or more reference ladders, and to provide an output comparison signal;
    an output, configured to receive the plurality of output comparison signals and to output a quantized signal corresponding to the input signal; and
    control logic, configured to control the switching arrangement in dependence on the quantized signal, wherein the one or more reference ladders are arranged in a quantizer.

* * * * *